United States Patent
Godbole

(10) Patent No.: US 8,330,547 B2
(45) Date of Patent: Dec. 11, 2012

(54) GAIN CONTROL LINEARITY IN AN RF DRIVER AMPLIFIER TRANSMITTER

(75) Inventor: Devavrata V Godbole, Carlsbad, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/636,637

(22) Filed: Dec. 11, 2009

(65) Prior Publication Data

US 2010/0327977 A1 Dec. 30, 2010

Related U.S. Application Data

(60) Provisional application No. 61/222,061, filed on Jun. 30, 2009.

(51) Int. Cl.
*H03F 1/22* (2006.01)
(52) U.S. Cl. .......... 330/311; 330/295
(58) Field of Classification Search .......... 330/277, 330/295, 302, 311
See application file for complete search history.

(56) References Cited

U.S. PATENT DOCUMENTS

| | | | |
|---|---|---|---|
| 6,236,238 B1 * | 5/2001 | Tanji et al. | 326/83 |
| 6,400,227 B1 * | 6/2002 | Goldfarb et al. | 330/295 |
| 6,504,431 B2 | 1/2003 | Weber et al. | |
| 6,504,433 B1 | 1/2003 | Weber et al. | |
| 6,580,117 B2 | 6/2003 | Shimizu | |
| 6,888,411 B2 * | 5/2005 | Behzad et al. | 330/311 |
| 7,126,428 B2 * | 10/2006 | Lin et al. | 330/311 |
| 7,276,976 B2 * | 10/2007 | Oh et al. | 330/311 |
| 7,295,071 B1 | 11/2007 | Lee | |
| 2010/0141337 A1 * | 6/2010 | Chen | 330/124 R |

FOREIGN PATENT DOCUMENTS

EP 1513256 3/2005

OTHER PUBLICATIONS

Afsahi A, et al., "Fully integrated dual-band power amplifiers with on-chip baluns i n 65nm CMOS for an 802.11n MIMO WLAN SoC" Radio Frequency Integrated Circuits Symposium, 2009. RFIC 2009. IEEE, IEEE, Piscataway, NJ, USA, Jun. 7, 2009, pp. 365-368, XP031480295 ISBN: 978-1-4244-3377-3 Chapter 11: Architecture and Circuit Implementation, figures 1-3.
International Search Report and Written Opinion—PCT/US2010/040682, International Search Authority—European Patent Office-Nov. 10, 2010.

\* cited by examiner

*Primary Examiner* — Khanh Nguyen
(74) *Attorney, Agent, or Firm* — Ramin Mobarhan

(57) ABSTRACT

An exemplary apparatus is disclosed that comprises a plurality of voltage to current transducers to convert an input signal voltage into a plurality of input signal currents and a cascode stage. The cascode stage is coupled to the voltage to current transducers to provide amplifier gain control. The cascode stage comprises a thin gate oxide transistor and a thick gate oxide transistor.

22 Claims, 5 Drawing Sheets

High Power Mode Gain Control Table 400

| | MS Cascode Device 1 (401) | Cascode Device 2 (402) | Cascode Device 3 (403) |
|---|---|---|---|
| GAIN 1 (405) | ON | ON | ON |
| GAIN 2 (410) | ON | OFF | ON |
| GAIN 3 (415) | ON | ON | OFF |
| ... | | | |
| GAIN N (420) | ON | OFF | OFF |

FIG. 4A

Low Power Mode Gain Control Table 450

| | MS Cascode Device 1 451 | Cascode Device 2 452 | Cascode Device 3 453 |
|---|---|---|---|
| GAIN 1 455 | ON | ON | ON |
| GAIN 2 460 | ON | OFF | ON |
| GAIN 3 465 | ON | ON | OFF |
| ... | | | |
| GAIN M 480 | OFF | OFF | OFF |

GAIN CONTROL LINEARITY IN AN RF DRIVER AMPLIFIER TRANSMITTER

CLAIM OF PRIORITY UNDER 35 U.S.C. §119

The present Application for Patent claims priority to Provisional Application No. 61/222,061, entitled "TC DA LINEARITY IMPROVEMENT" filed Jun. 30, 2009, and assigned to the assignee hereof and hereby expressly incorporated by reference herein.

BACKGROUND

Amplifiers are commonly used in various electronic devices to provide signal amplification. Different types of amplifiers are available for different uses. For example, a wireless communication device such as a cellular phone may include a transmitter and a receiver for bi-directional communication. The transmitter may utilize a driver amplifier (DA) and a power amplifier (PA), the receiver may utilize a low noise amplifier (LNA), and the transmitter and receiver may utilize variable gain amplifiers (VGAs).

To reduce cost and improve integration, metal oxide semiconductor field effect transistors (MOSFETs) are often used in radio frequency (RF) circuits in wireless devices and other applications. In particular, MOSFETs are often used in driver amplifiers for wireless devices.

Today's driver amplifiers for wireless devices require high quality linearity performance while at the same time requiring very strong reliability. Unfortunately, transistors, such as MOSFETs, used in present driver amplifiers for wireless devices, often provide non-linear performance and inadequate reliability. There is therefore a need in the art for an amplifier with both high quality linearity and reliability.

BRIEF DESCRIPTION OF THE DRAWING

FIG. 4A is a diagram illustrating a gain control table for a high power mode that may be utilized with the driver amplifier transmitter.

FIG. 4B is a diagram illustrating a gain control table for a low power mode that may be utilized with the driver amplifier transmitter.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein. The exemplary driver amplifier described herein may be used for various electronic devices such as cellular phones, personal digital assistants (PDAs), handheld devices, wireless modems, laptop computers, cordless phones, Blue-Tooth devices, consumer electronic devices, etc. For clarity, the use of the exemplary driver amplifier in a wireless device, which may be a cellular phone or some other device, is described below.

Figure 1:
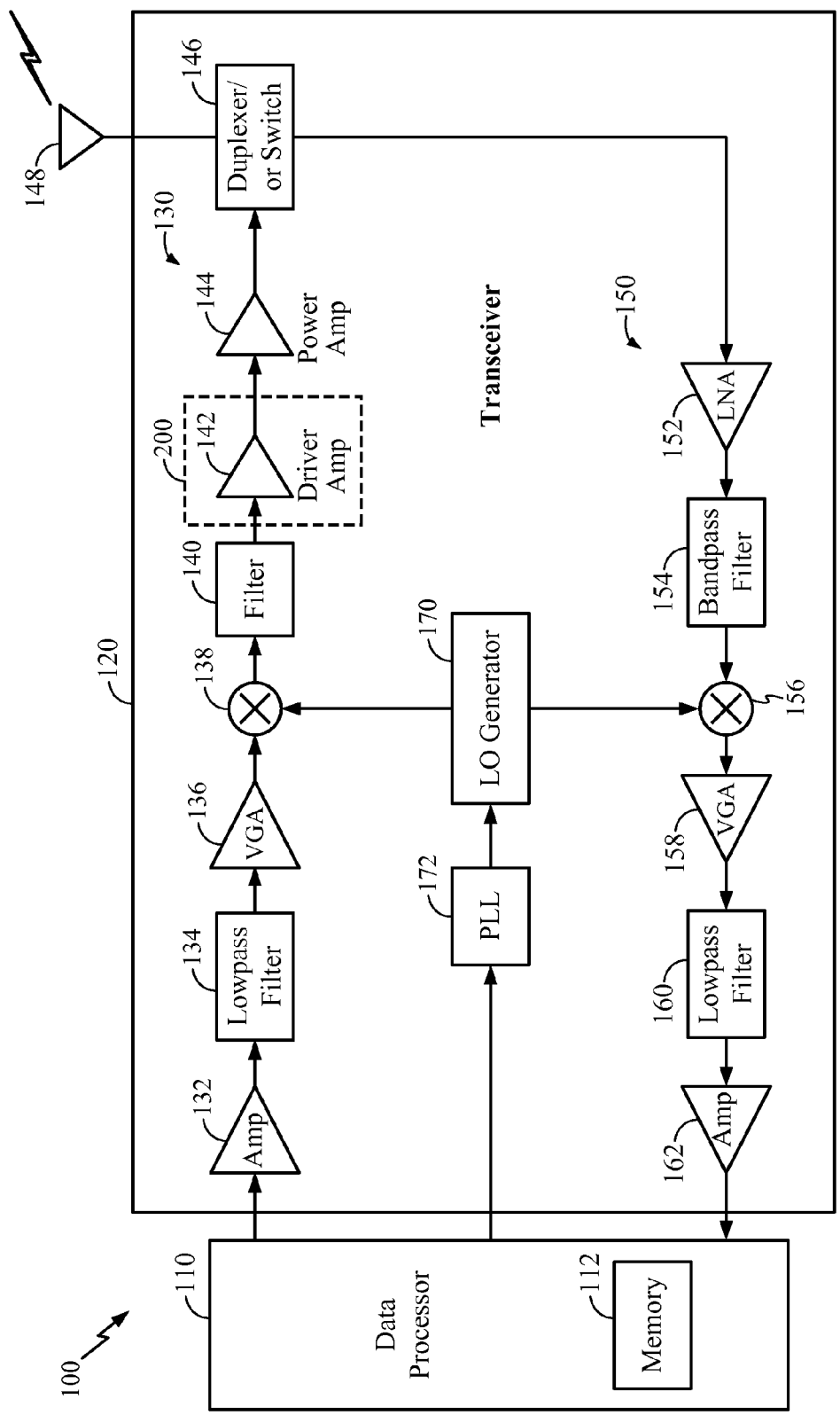
FIG. 1 shows a block diagram of an exemplary design of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to RF by a mixer 138. The upconverted signal is filtered by a filter 140 to remove images caused by the frequency upconversion, further amplified by a driver amplifier (DA) 142 and a power amplifier (PA) 144, routed through a duplexer/switch 146, and transmitted via an antenna 148. Driver amplifier 142 will be described in more detail as driver amplifier 200 in FIG. 2.

In the receive path, antenna 148 receives signals from base stations and provides a received signal, which is routed through duplexer/switch 146 and provided to receiver 150. Within receiver 150, the received signal is amplified by an LNA 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a super-heterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on an analog integrated circuit (IC), an RF IC (RFIC), a mixed-signal IC, etc. For example, amplifier 132 through driver amplifier 142 in transmitter 130 may be implemented on an RFIC whereas power amplifier 144 may be implemented external to the RFIC.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

As shown in FIG. 1, a transmitter and a receiver may include various amplifiers. Each amplifier may be implemented with various designs. Each amplifier may have certain requirements related to linearity and/or other parameters.

Figure 2:
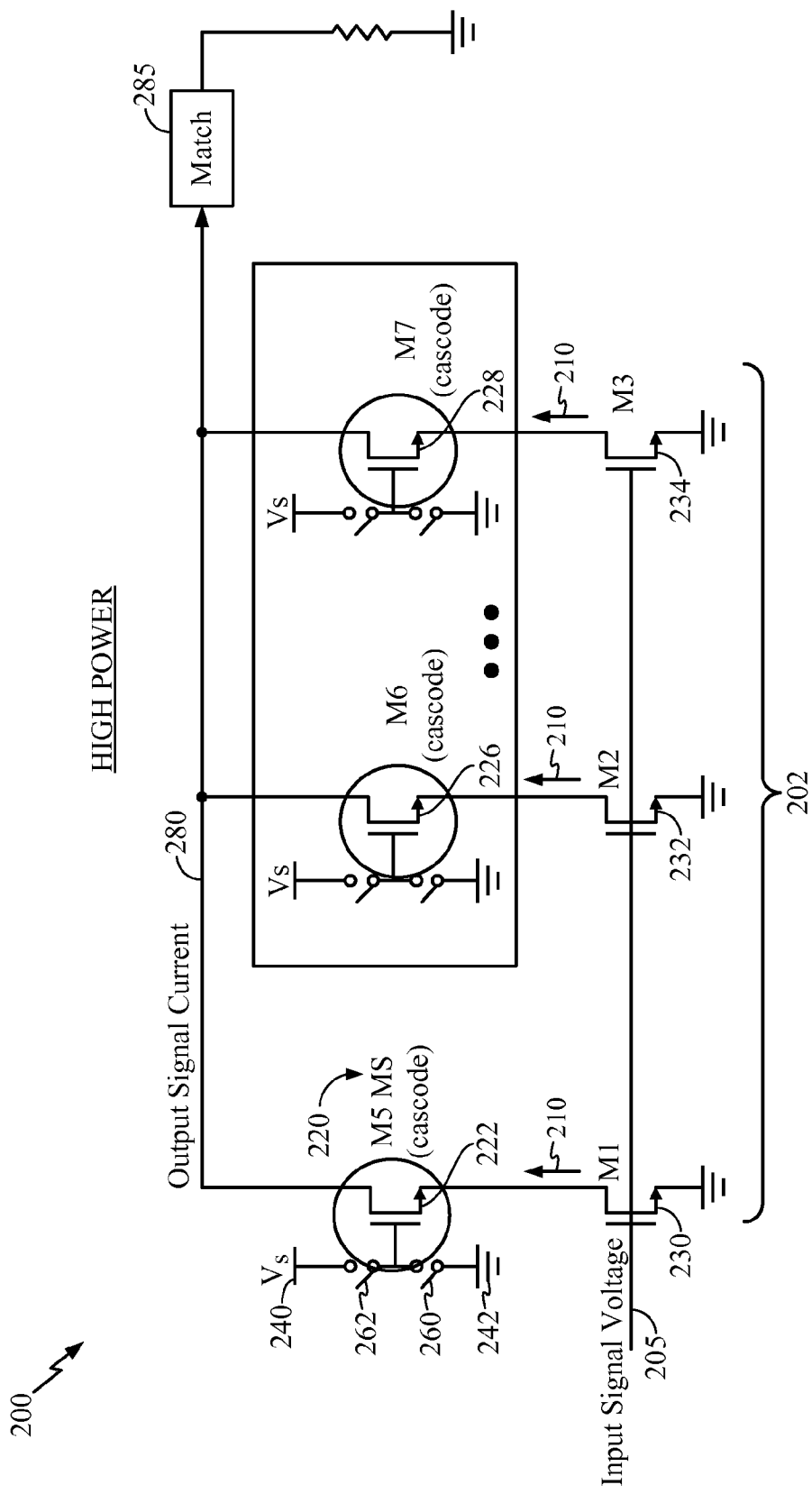
FIG. 2 shows a schematic diagram of a driver amplifier transmitter to provide amplifier gain control linearity for transmitting high power.

FIG. 2 shows a schematic diagram of a driver amplifier transmitter 200 to provide amplifier gain control linearity. Amplifier 200 may be used for driver amplifier 142 as previously described with reference to FIG. 1. Amplifier 200 supplies improved driver amplifier linearity while maintaining device reliability.

Amplifier 200 includes a plurality of voltage to current transducers 202 to convert an input signal voltage 205 into a plurality of input signal currents 210.

A cascode stage 220 is coupled to the voltage to current transducers 202 to provide amplifier gain control. The cascode stage 220 includes a thin gate oxide transistor 222 and a first and second thick oxide gate transistor 226 and 228. It should be appreciated that any number of thick gate oxide transistors may be utilized in the cascode stage and that this is but one example.

In an exemplary embodiment, the plurality of voltage to current transducers 202 are transistors. For example, the plurality of transistors may be MOSFETs (M1, M2, and M3) 230, 232, and 234. Further, the thin oxide gate transistor 222 and the thick gate oxide transistors 226 and 228 of the cascode stage 220 may also be MOSFETs (M5, M6, and M7). The thin gate MOSFET 222 may be the most significant (MS) transistor of the cascode stage 220.

The MOSFETs 230, 232, and 234 convert the input signal voltage 205 applied at their gates to equivalent currents 210 at their drains. The drain currents 210 of the MOSFETs 230, 232, and 234 are then fed to the source of the cascode MOSFETs 222, 226, and 228 of cascode stage 220.

The driver amplifier (DA) 200 gain control is implemented by either pulling the gate voltage of cascode devices (M5, M6, M7) 222, 226, 228 to supply voltage ($V_s$) 240 to turn the MOSFETs ON or by pulling the gate voltage to ground 242 to turn the MOSFETs OFF.

In an exemplary embodiment, each of the MOSFETs 222, 226, and 228 include a plurality of switches 260 and 262 to control turning OFF or ON the associated MOSFET of the cascode stage 220. For example, as will be described in more detail below, in one exemplary embodiment, a digital gain control table may be utilized to control the plurality of switches.

Typically, thin gate oxide MOSFETs have superior linearity performance as compared to thick gate oxide MOSFETs, but, may have reliability issues at high power levels. On the other hand, thick gate oxide MOSFETs typically have poorer linearity performance but provide superior reliability.

In one exemplary embodiment of the invention, to achieve a good tradeoff between reliability and linearity performance, when driver amplifier 200 is at high power, the most significant (MS) MOSFET transistor 222 is turned ON (e.g. switch 262 is turned on to $V_s$ 240).

Further, at high power, the thick gate oxide MOSFETs may also be turned ON (e.g. switches 262 are turned on to $V_s$) and MOSFETs 226 and 228 are used for gain control. In this way the output signal current 280 is applied to the rest of the system, shown as match 285, which in an exemplary embodiment relates to power amplifier 144, duplexer switch 146 and antenna 148 (see FIG. 1). However, it should be appreciated that some of the MOSFETs 226 and 228 may be turned OFF during gain control at the high power mode.

Utilizing this exemplary embodiment of the invention, a low impedance path is applied to input signal voltage 205 such that output signal current 280 may be applied at high power to an antenna with very good linearity performance due to the most significant (MS) thin gate MOSFET 222 whereas reliable gain control is applied by thick gate oxide MOSFETs 226 and 228. In particular, the thick gate oxide MOSFETs 226 and 228 do not have reliability issues at high power and provide proper gain control.

Thus, in one exemplary embodiment, at high power, the most significant (MS) MOSFET 222 is always ON. In this way, the thin gate oxide MOSFET 222 applies very good linearity performance. Whereas the thick gate oxide MOSFETs 226 and 228 provide proper gain control with good reliability.

The driver amplifier (DA) system 200 allows for superior linearity performance for high power output signal currents 280 such as cell bands for the global system for mobile (GSM) communications (e.g. at approximately 13 dBm output power), as well as code division multiple access (CDMA), wideband CDMA, and long term evolution (LTE) cell bands (e.g. at approximately 7 dBm output power).

Figure 3:
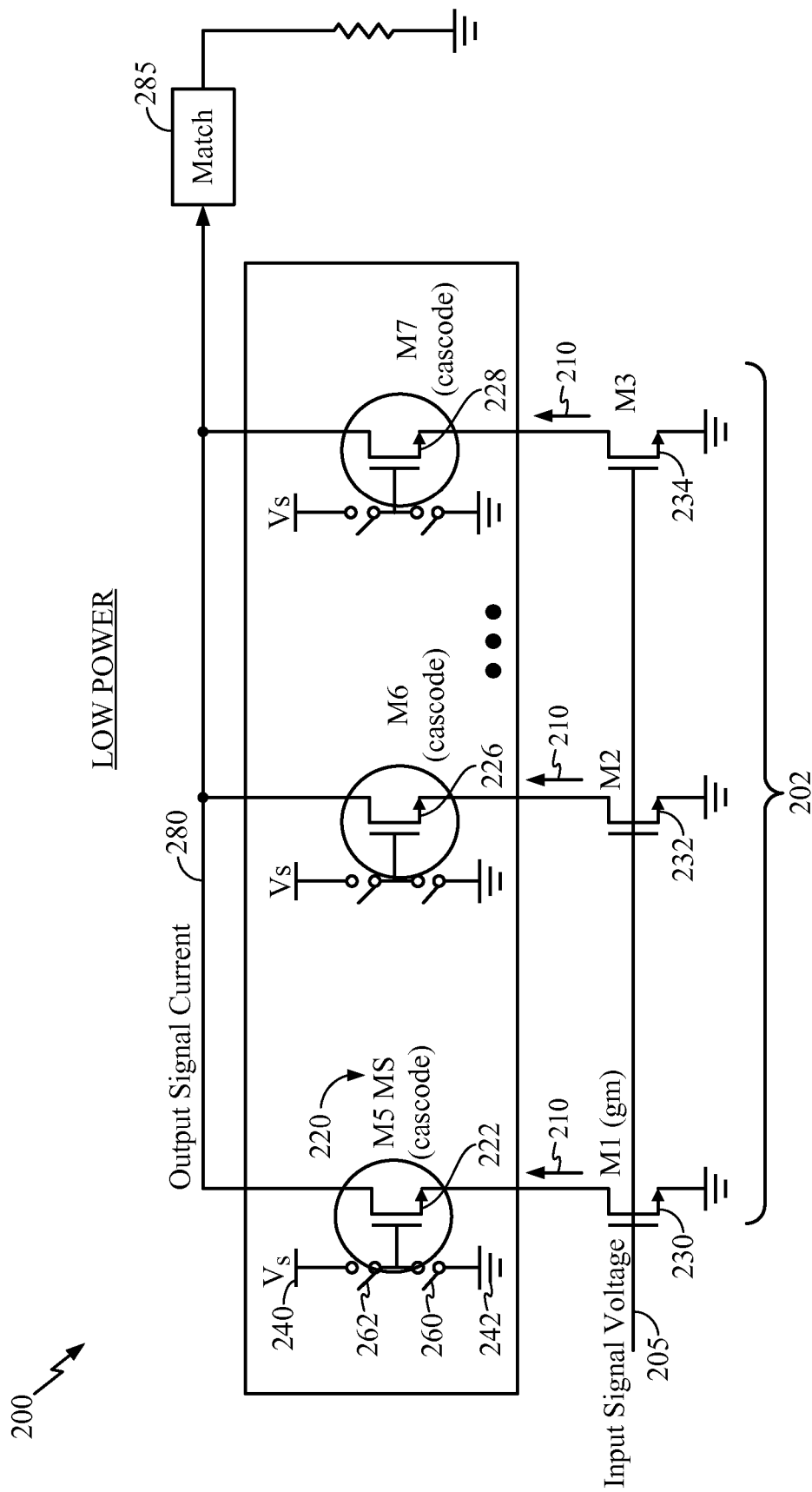
FIG. 3 shows another schematic diagram of the driver amplifier transmitter to provide amplifier gain control linearity for transmitting low power.

FIG. 3 shows another schematic diagram of the driver amplifier transmitter 200 to provide amplifier gain control linearity in a low power mode. In the low power mode, driver amplifier transmitter 200 may provide high impedance and prevent the input signal voltage 205 from becoming an output signal current 280 to the amplifier. When in low power mode, all of the MOSFETs 222, 226, and 228 may be set to OFF by being grounded and are merely utilized for gain control to reduce the output power to 0 dBm or another associated low power level. However, it should be appreciated that some of the MOSFETs 222, 226, and 228 may be turned ON for gain control at low power mode. It should be appreciated that any number of thick gate oxide MOSFETs may be utilized for gain control dependent upon design considerations.

As previously described, in one exemplary embodiment, a digital control table may be utilized to control the plurality of switches to turn the cascode devices 222, 226, and 228 ON and OFF to implement gain control.

FIG. 4A is a diagram illustrating a gain control table 400 for a high power mode that may be utilized with driver amplifier transmitter 200. As shown in FIG. 4A, the most significant (MS) cascode device 1 222 is shown in column 401, cascode device 2 226 is shown in column 402, and cascode device 3 228 is shown in column 403. As examples, a first gain control setting (Gain 1) is shown in which all of the cascode devices are turned ON (row 405). As another example, in row 410, a second gain setting (Gain 2) is shown in which MS cascode device 1 222 is ON, cascode device 2 226 is OFF, and cascode device 3 228 is ON. In another example, for a third gain control setting (Gain 3), MS cascode device 1 222 is ON, cascode device 2 226 is ON, and cascode device 3 228 is OFF (row 415). In yet another example of a gain control setting (Gain N), MS cascode device 1 222 is ON and cascode devices 2 and 3 226 and 228 are set to OFF (row 420).

It should be appreciated that any number of different gain control settings may be implemented along with any number of cascode devices in the drive amplifier transmitter 200 and that the utilization of three cascode devices with the previously-described gain control table is given as just one example. Further, as previously described, when a cascode device is switched to ON, switch 262 is set to the voltage source ($V_s$) 240 and when the cascode device is set to OFF, switch 260 is set to ground 242. As should be noted in the high power mode, the MS cascode device 1 is always set to ON.

FIG. 4B is a diagram illustrating a gain control table 450 for a low power mode that may be utilized with driver amplifier transmitter 200. As shown in FIG. 4B, the most significant (MS) cascode device 1 222 is shown in column 451, cascode device 2 226 is shown in column 452, and cascode device 3 228 is shown in column 453. As examples, a first gain control setting (Gain 1) is shown in which all of the cascode devices are turned ON (row 455). As another example, in row 460, a second gain setting (Gain 2) is shown in which MS cascode device 1 222 is ON, cascode device 2 226 is OFF, and cascode device 3 228 is ON. In another example, for a third gain control setting (Gain 3), MS cascode device 1 222 is ON, cascode device 2 226 is ON, and cascode device 3 228 is OFF (row 465). In yet another example of a gain control setting (Gain M), MS cascode device 1 222 is ON and cascode devices 2 and 3 226 and 228 are set to OFF (row 480).

It should be appreciated that any number of different gain control settings may be implemented along with any number of cascode devices in the drive amplifier transmitter 200 and that the utilization of three cascode devices with the previously-described gain control table is given as just one example. Further, as previously described, when a cascode device is switched to ON, switch 262 is set to the voltage source (Vs) 240 and when the cascode device is set to OFF, switch 260 is set to ground 242.

It should further be appreciated that, in low power mode, the maximum output power value may be set such that the reliability requirements for the MS thin gate oxide device 222 are not violated when it is turned OFF. Further, the boundary between the low power and high power modes of operation may be set to depend upon the reliability conditions for the MS thin gate oxide device and therefore the boundaries may be process dependent.

According to the exemplary embodiments of the invention, by utilizing a thin oxide gate MOSFET as the most significant (MS) device that is permanently ON in the high power mode, very good linearity performance is provided, whereas the rest of the cascode devices are thick gate oxide MOSFETs used for gain control that ensure minimal reliability issues. On the other hand, when in low power mode, all of the MOSFET devices may be utilized for gain control. Thus, superior linearity performance is provided without sacrificing reliability.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
   a plurality of voltage to current transducers to convert an input signal voltage into a plurality of input signal currents; and
   a cascode stage coupled to the voltage to current transducers to provide gain control to the plurality of voltage to current transducers, the cascode stage comprising a thin gate oxide transistor for one of the plurality of voltage to current transducers and a thick gate oxide transistor for another one of the plurality of voltage to current transducers.

2. The apparatus of claim 1, wherein the plurality of voltage to current transducers comprises a plurality of transistors.

3. The apparatus of claim 2, wherein the plurality of transistors comprises MOSFETs.

4. The apparatus of claim 1, wherein the thin oxide gate transistor of the cascode stage comprises a MOSFET.

5. The apparatus of claim 1, wherein the thick gate oxide transistor of the cascode stage comprises a MOSFET.

6. The apparatus of claim 1, wherein the thin gate oxide transistor comprises the most significant (MS) transistor of the cascode stage.

7. The apparatus of claim 6, further comprising a plurality of switches, the plurality of switches to control turning off or on the thin gate oxide and thick gate oxide transistors of the cascode stage.

8. The apparatus of claim 7, further comprising a digital gain control table, the digital gain control table to control the plurality of switches.

9. A method comprising:
   converting an input signal voltage into a plurality of input signal currents; and
   providing gain control to the plurality of input signal currents by coupling the plurality of input signal currents to a cascode stage, the cascode stage comprising a thin gate oxide transistor for one of the plurality of input signal currents and a thick gate oxide transistor for another one of the plurality of input signal currents.

10. The method of claim 9, wherein the thin oxide gate transistor of the cascode stage comprises a MOSFET.

11. The method of claim 9, wherein the thick gate oxide transistor of the cascode stage comprises a MOSFET.

12. The method of claim 9, wherein the thin gate oxide transistor comprises the most significant (MS) transistor of the cascode stage.

13. The method of claim 12, further comprising controlling the turning off or on of the thin gate oxide and thick gate oxide transistors with a plurality of switches.

14. The method of claim 13, wherein a digital gain control table is used to control the plurality of switches.

15. An apparatus comprising:
   means for converting an input signal voltage into a plurality of input signal currents; and
   means for providing gain control to the plurality of input signal currents, the means for providing gain control comprising a thin gate oxide transistor for one of the plurality of input signal currents and a thick gate oxide transistor for another one of the plurality of input signal currents.

16. The apparatus of claim 15, wherein the means for converting the input signal voltage into the plurality of input signal currents comprises a plurality of transistors.

17. The apparatus of claim 16, wherein the plurality of transistors are MOSFETs.

18. The apparatus of claim 15, wherein the means for providing gain control to the plurality of input signal currents comprises a cascode stage.

19. The apparatus of claim 18, wherein the thin oxide gate transistor of the cascode stage comprises a MOSFET.

20. The apparatus of claim 18, wherein the thick gate oxide transistor of the cascode stage comprises a MOSFET.

21. The apparatus of claim 18, wherein the thin gate oxide transistor comprises the most significant (MS) transistor of the cascode stage.

22. The apparatus of claim 21, further comprising means for control turning off or on the thin gate oxide and thick gate oxide transistors of the cascode stage.

* * * * *